US008279699B2

(12) United States Patent
Zhang

(10) Patent No.: US 8,279,699 B2
(45) Date of Patent: Oct. 2, 2012

(54) SEMICONDUCTOR MEMORY DEVICE WITH REDUCED POWER NOISE

(75) Inventor: Pyung-Moon Zhang, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 347 days.

(21) Appl. No.: 12/708,188

(22) Filed: Feb. 18, 2010

(65) Prior Publication Data

US 2010/0214866 A1 Aug. 26, 2010

(30) Foreign Application Priority Data

Feb. 20, 2009 (KR) ........................ 10-2009-0014434

(51) Int. Cl.
*G11C 8/00* (2006.01)

(52) U.S. Cl. ..................... 365/223; 365/233.5; 365/226; 365/227

(58) Field of Classification Search .................. 365/233, 365/233.5, 226, 227
See application file for complete search history.

(56) References Cited

U.S. PATENT DOCUMENTS 5,881,000 A * 3/1999 Maeda ..................... 365/189.09
6,154,415 A * 11/2000 Jeong .......................... 365/233.1
6,166,990 A * 12/2000 Ooishi et al. ............. 365/233.11
6,489,819 B1 * 12/2002 Kono et al. .................. 327/141
6,744,687 B2 * 6/2004 Koo et al. ..................... 365/226
6,870,416 B2 * 3/2005 Cho ............................. 327/299
7,253,676 B2 8/2007 Fukuda et al.
7,420,873 B2 * 9/2008 Jang ........................... 365/233.1

FOREIGN PATENT DOCUMENTS

JP 2005-190533 7/2005
JP 2005-267712 9/2005
JP 2006-216147 8/2006
KR 1020050065424 6/2005

* cited by examiner

*Primary Examiner* — Connie Yoha
(74) *Attorney, Agent, or Firm* — F. Chau & Associates, LLC

(57) ABSTRACT

A semiconductor memory device includes an internal clock generator configured to generate an internal clock signal having a first clock period in response to a chip enable signal and change the first clock period of the internal clock signal in response to a clock control signal, and a controller configured to receive external commands including the chip enable signal and generate the clock control signal corresponding to a first external command other than the chip enable signal. Here, the semiconductor memory device performs a data input/output operation in response to the internal clock signal with the changed clock period.

16 Claims, 2 Drawing Sheets

SEMICONDUCTOR MEMORY DEVICE WITH REDUCED POWER NOISE

CROSS-REFERENCE TO RELATED APPLICATION

This application claims priority under 35 U.S.C. §119 to Korean Patent Application No. 10-2009-0014434, filed on Feb. 20, 2009, the disclosure of which is incorporated by reference herein in its entirety.

BACKGROUND

1. Technical Field

The inventive concept relates to a semiconductor memory device, and more particularly, to a semiconductor memory device with reduced power noise.

2. Discussion of Related Art

A semiconductor memory device such as a flash memory device receives an external power supply voltage having a low voltage level (e.g., 1.8 V) and generates an internal boosted voltage having a voltage level (e.g., 10 V) that is higher than the power supply voltage to perform program, erase and read operations. Accordingly, a nonvolatile semiconductor memory device includes a boosting circuit for receiving a power supply voltage to generate a boosted voltage, a core unit including a memory cell array, and a logic circuit for controlling the boosting circuit and the core unit and inputting/outputting data to/from the exterior. The boosted voltage generated by the boosting circuit is applied to the memory cell array and used to program, erase and read data stored in a plurality of memory cells in the memory cell array.

When the boosting circuit generates the boosted voltage, particularly, when it begins to generate the boosted voltage, current consumption may suddenly increase. The logic circuit, operating with the power supply voltage, controls the semiconductor memory device and can perform various operations to input/output data even while the boosting circuit is generating the boosted voltage. Accordingly, current consumption occurs in the logic circuit, as well as in the boosting circuit, when the boosting circuit is generating the boosted voltage; further contributing to the sudden increase in current consumption. This sudden change in current consumption may generate a surge or power noise that can obstruct the stability of the level of the power supply voltage. For example, the power supply voltage may be leveled down because the power noise has a greater influence on the logic circuit since the logic circuit operates with a power voltage that is lower than a boosted voltage used to operate the memory cell array. The leveled-down power supply voltage may cause the boosted voltage to be leveled down, which can retard data program, erase and read operations for memory cells, thereby resulting in a reduced operation speed of the semiconductor memory device. Further, the leveled-down power supply voltage may cause the logic circuit to malfunction, potentially resulting in a fatal error in the semiconductor memory device.

In addition, the power noise may be generated solely by the boosting circuit when it generates the boosted voltage and also when current consumption in the logic circuit increases due to performing various operations of the semiconductor memory device while the boosting circuit does not operate. The applied power supply voltage itself may include power noise.

Accordingly, there is a need to reduce the effect of power noise on a semiconductor memory device.

SUMMARY

An exemplary embodiment of the inventive concept provides a semiconductor memory device with reduced power noise.

An exemplary embodiment of the inventive concept provides a semiconductor memory device including: an internal clock generator configured to generate an internal clock signal having a first clock period in response to a chip enable signal and change the first clock period of the internal clock signal in response to a clock control signal; and a controller configured to receive external commands including the chip enable signal and generate the clock control signal corresponding to a first external command other than the chip enable signal. Here, the semiconductor memory device performs a data input/output operation in response to the internal clock signal with the changed clock period.

The controller may set a level of the clock control signal corresponding to the first external command to be different than a level of a clock control signal corresponding to a second external command other than the chip enable signal.

The internal clock generator may change the first clock period of the internal clock signal according to the level of the clock control signal corresponding to the first external command.

The controller may set an activation period of the clock control signal corresponding to the first external command to be different than an activation period of the clock control signal corresponding to the second external command.

The internal clock generator may include an oscillator changing the first clock period of the internal clock signal in response to the clock control signal corresponding to the first external command and outputting a first resultant internal clock signal as the internal clock signal with the changed clock period.

The internal clock generator may further include a power supply voltage sensor receiving a power supply voltage, sensing a level change of the power supply voltage, and outputting a sensing signal, and the oscillator may change the clock period of the first resultant internal clock signal in response to the sensing signal and output a second resultant internal clock signal as an internal clock signal with a newly changed clock period.

The device may further include a core unit including a plurality of memory cells and the core unit may select and activate a memory cell corresponding to an address.

The device may further include a data input/output unit performing the data input/output operation to input/output data to/from the core unit in response to an internal command generated by the controller decoding the first external command and in response to the internal clock signal corresponding to the first external command.

The device may further include a boosting circuit receiving a boosted-voltage generation signal from the controller, generating at least one boosted voltage, and outputting the generated boosted voltage to the core unit.

The device may include a buffer circuit including a plurality of memory cells and the buffer circuit may buffer data between an exterior of the semiconductor memory device and the data input/output unit.

The changed clock period may be longer than the first clock period.

An exemplary embodiment of the inventive concept provides a semiconductor memory device, including: an internal clock generator configured to generate an internal clock signal having first and second clock periods that are different from each other in response to a first external command and an internal clock signal having a third clock period different than the first and second clock periods in response to a second external signal, wherein the first and second clock periods are based on current consumed by the semiconductor memory device when executing the first external command and the third clock period is based on current consumed by the semiconductor memory device when executing the second external command.

The first clock period may be longer than the second clock period.

The first clock period may occur when the first external command is initially executed.

The second clock period may occur after the first clock period for a remainder of the execution of the first external command.

The first and second external commands may include program, erase, read or data input/output commands.

An exemplary embodiment of the inventive concept provides a semiconductor memory device, including an initial clock generator configured to generate an internal clock signal having a first clock period and change the first clock period of the internal clock signal in response to a level change of a power supply voltage.

The initial clock generator may include a power supply voltage sensor configured to sense the level change of the power supply voltage and output a sensing signal and an oscillator configured to change the first clock period of the internal clock signal in response to the sensing signal.

The changed clock period may be longer than the first clock period.

BRIEF DESCRIPTION OF THE DRAWINGS

The above and other features of the inventive concept will become more apparent by describing in detail exemplary embodiments thereof with reference to the accompanying drawings.

DETAILED DESCRIPTION OF THE EMBODIMENTS

Exemplary embodiments of the inventive concept will now be described more fully with reference to the accompanying drawings.

The inventive concept may, however, be embodied in many alternate forms and should not be construed as limited to only the exemplary embodiments set forth herein.

Figure 1:
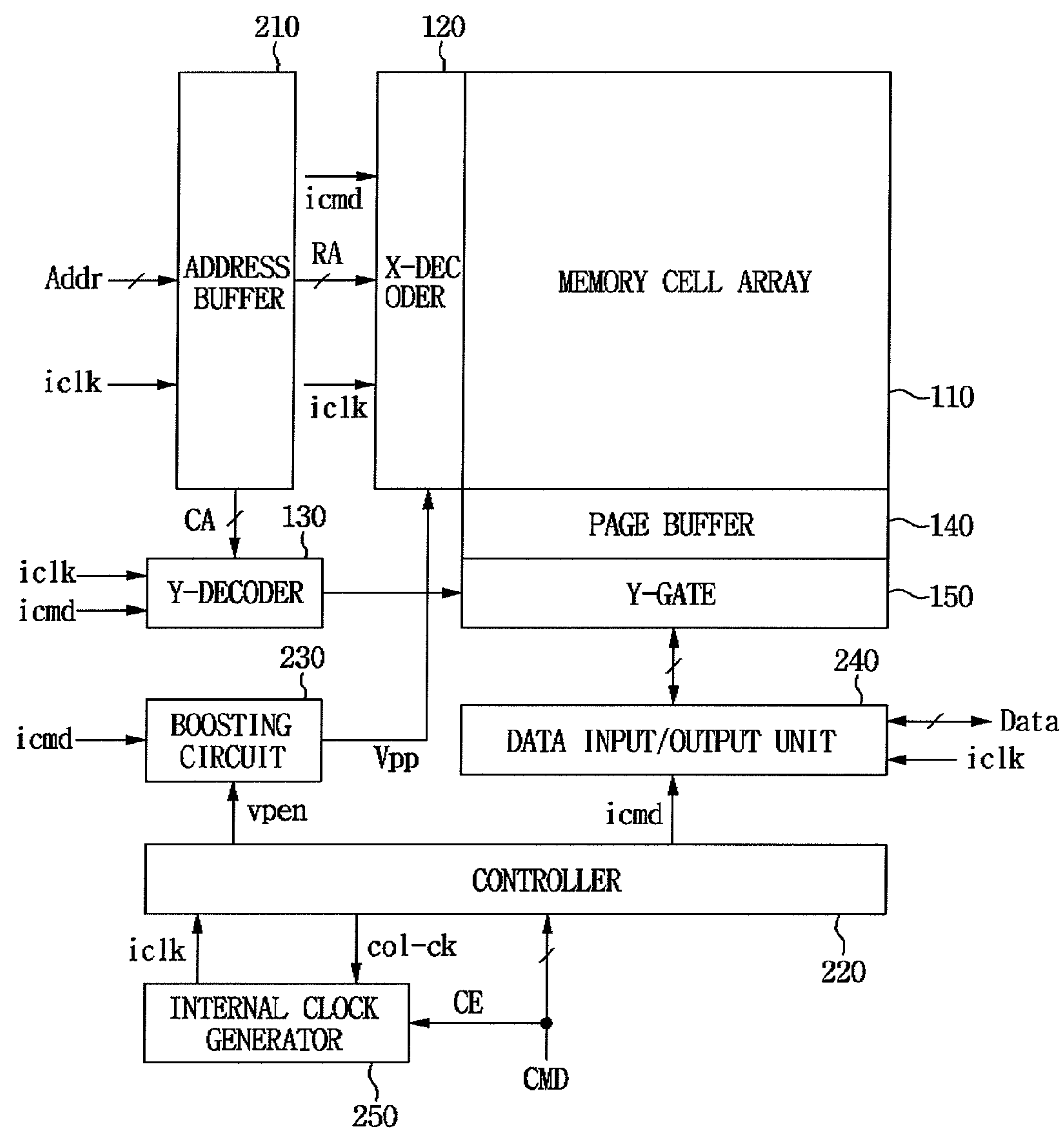
FIG. 1 illustrates a semiconductor memory device according to an exemplary embodiment of the inventive concept.

FIG. 1 illustrates a flash memory device as an example of a semiconductor memory device according to an exemplary embodiment of the inventive concept. In FIG. 1, the semiconductor memory device may include a core unit, a boosting circuit 230, and a logic circuit. The core unit may include a memory cell array 110, an X-decoder 120, a Y-decoder 130, a page buffer 140 and a Y-gate 150. The logic circuit may include an address buffer 210, a controller 220, a data input/output unit 240, and an internal clock generator 250.

In the semiconductor memory device of FIG. 1, the memory cell array 110 includes a plurality of memory cells. The address buffer 210 receives an external address Addr and outputs a row address RA and a column address CA, and the X-decoder 120 decodes the row address RA and selects a plurality of memory cells in units of pages. The page buffer 140 includes a plurality of buffers, temporarily stores data in a memory cell selected in units of pages by the X-decoder 120 and operates as a sense amplifier in a read operation and as a driver in a program operation. The Y-decoder 130 decodes the column address CA and selects and activates a plurality of gates in the Y-gate 150. The Y-gate 150 includes a plurality of gates, and the gate selected by the Y-decoder 130 is activated to select data in the page buffer 140 in units of bits and output the data.

The data input/output unit 240 receives the data from the Y-gate 150 and outputs the data to the exterior. The controller 220 includes a command decoder (not shown), decodes an external command CMD and outputs a corresponding internal command icmd, and in particular, outputs a boosted-voltage generation signal vpen for activating the boosting circuit 230. In addition, the controller 220 outputs a clock control signal col-ck to the internal clock generator 250 in response to the internal command icmd.

The boosting circuit 230 is activated in response to the boosted-voltage generation signal vpen to generate a boosted voltage Vpp and output the boosted voltage Vpp to the X-decoder 120. In this case, the boosting circuit 230 may receive the internal command icmd and generate a boosted voltage Vpp corresponding to the internal command icmd.

Since the flash memory device may use different high voltages in program, erase and read operations and a plurality of boosted voltages having different levels, the boosting circuit 230 may receive an internal command icmd and generate at least one boosted voltage Vpp corresponding to the internal command icmd. The X-decoder 120 receives at least one boosted voltage Vpp and activates the memory cells in the memory cell array 110 in units of pages using the at least one boosted voltage Vpp.

The internal clock generator 250 is activated in response to a chip enable signal CE to activate the semiconductor memory device, and generates and outputs an internal clock signal iclk. In addition, the internal clock generator 250 receives the clock control signal col-ck from the controller 220, changes a clock period of the internal clock signal iclk, and outputs a resultant internal clock signal.

In FIG. 1, when an external command CMD causing a sudden increase in current consumption in the semiconductor memory device is input, the controller 220 generates an internal command icmd and simultaneously applies a clock control signal col-ck to the internal clock generator 250. The external command CMD causing the sudden increase in current consumption in the semiconductor memory device may be recognized in advance through a test. Representative external commands include program, erase and read commands activating the boosting circuit 230, as described above. There may be commands that effectuate the operation of the logic circuit and cause a sudden increase in current consumption even when the boosting circuit 230 does not operate. Accordingly, the controller 220 in the semiconductor memory device according to an exemplary embodiment of the inventive concept is set in advance to activate the clock control signal col-ck when an external command recognized as a command causing a sudden increase in current consumption through a test is input. The internal clock generator 250 outputs the internal clock signal iclk having an increased period in response to the clock control signal col-ck, and an operation speed of the logic circuit is determined in response to the internal clock signal iclk. Accordingly, when an external command causing a lot of current consumption is input, the operation speed of the logic circuit becomes slow, thereby reducing the speed of the change in current consumption. In other words, power noise can be reduced.

A flash memory device does not require synchronization with an external device, unlike a synchronous semiconductor memory device that always generates an internal clock signal when a power supply voltage is applied and operates with the internal clock signal synchronized with an external clock signal. When the flash memory device is not in use, a chip enable signal CE is deactivated so that an internal clock signal iclk is not generated even when a power supply voltage is applied. In addition, since components of a logic circuit in semiconductor memory devices, except for some synchronous semiconductor memory devices, perform their specified operations corresponding to an internal clock signal iclk and, particularly, a clock number of the internal clock signal iclk, an increased period of the internal clock signal iclk retards an operation speed of the semiconductor memory device, but does not cause the device to malfunction.

Even when an external command causing a lot of current consumption is input, an increase in the period of the internal clock signal iclk is not required in all intervals in which operations corresponding to the external command are performed. This is so, because the power noise is generated due to a sudden change in current consumption rather than an increase in current consumption. Accordingly, power noise can be reduced by increasing the period of the internal clock signal iclk only in an initial interval in which an external command causing a lot of current consumption is input. In other words, the controller 220 may differently set intervals in which the period of the internal clock signal iclk increases, according to respective external commands causing a lot of current consumption through a test. Here, an initial part of an interval in which the period of the internal clock signal iclk increases as the external command causing a lot of current consumption is input may be set in advance through a test.

Accordingly, when the external command causing a lot of current consumption is input, the logic circuit in the semiconductor memory device according to an exemplary embodiment of the inventive concept operates at a low operation speed, but continuously. In addition, since intervals in which the period of the internal clock signal iclk increases may be differently set according to external commands, the semiconductor memory device operates at a slow operation speed only in a short period of time. In other words, there is a very small difference in operation speed between a semiconductor memory device using an internal clock signal iclk having a fixed period and the semiconductor memory device according to an exemplary embodiment of the inventive concept.

Current consumption in the semiconductor memory device may be different for different external commands CMD. In other words, since the semiconductor memory device performs different operations in response to different external commands, the amount of current consumed by the semiconductor memory device is different when executing different external commands. In this case, in the semiconductor memory device according to an exemplary embodiment of the inventive concept, the clock period of the internal clock signal iclk may be differently set for external commands causing a lot of current consumption and external commands causing relatively less current consumption. To differently adjust the period of the internal clock signal iclk according to external commands, the clock control signal col-ck may have a plurality of bits. By variously changing the clock period of the internal clock signal iclk in consideration of current consumption caused by executing the external commands, the semiconductor memory device operates at a higher operation speed, compared with the case where the period of the internal clock signal iclk is set equally and longer for the external commands causing a lot of current consumption.

Figure 2:
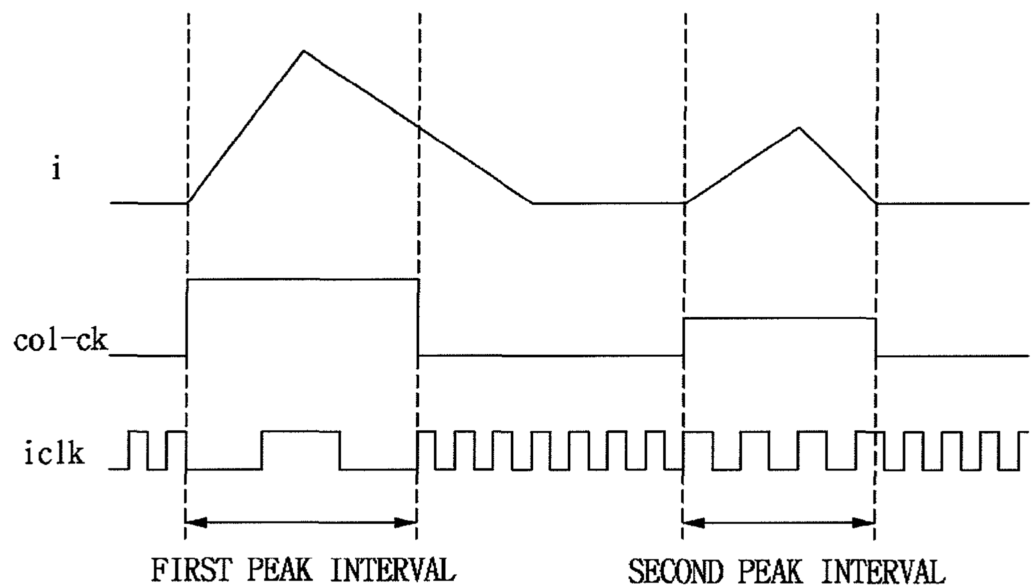
FIG. 2 illustrates an internal clock signal and a clock control signal of the semiconductor memory device in FIG. 1.

FIG. 2 illustrates an internal clock signal and a clock control signal of the semiconductor memory device in FIG. 1.

In FIG. 2, current i indicates a current consumption amount of the semiconductor memory device according to external commands CMD. In a first peak interval of FIG. 2, a lot of current consumption occurs, and in a second peak interval, relatively less current consumption occurs. For example, a program, erase or read command is input to the semiconductor memory device in the first peak interval so that the boosting circuit 230 can generate a boosted voltage Vpp, and a plurality of data DATA are simultaneously output from the data input/output unit 240 in the second peak interval.

Whether external commands CMD correspond to the first and second peak intervals may be set in the controller 220 through a test in advance, as described above. The controller 220 generates a clock control signal col-ck corresponding to the input external command CMD, and outputs the clock control signal col-ck to the internal clock generator 250. When the clock control signal col-ck from the controller 220 does not indicate which of the first and second peak intervals corresponds to the external command CMD, the internal clock generator 250 generates and outputs an internal clock signal iclk having a first time period. However, when the clock control signal col-ck indicates the first peak interval, the internal clock generator 250 generates and outputs an internal clock signal iclk having a second time period relatively longer than the first time period. For example, the second time period may be set at double the first time period. When the clock control signal col-ck indicates the second peak interval, the internal clock generator 250 generates and outputs an internal clock signal iclk having a third time period between the first time period and the second time period.

Although, in FIG. 2, intervals in which a lot of current consumption occurs in the semiconductor memory device are classified into the first and second peak intervals, additional intervals in which a lot of current consumption occurs may be classified.

Thus, the nonvolatile semiconductor memory device according to an exemplary embodiment of the inventive concept generates an internal clock signal iclk having a period corresponding to the external command CMD and operates in response to the generated internal clock signal iclk, thereby reducing power noise.

Figure 3:
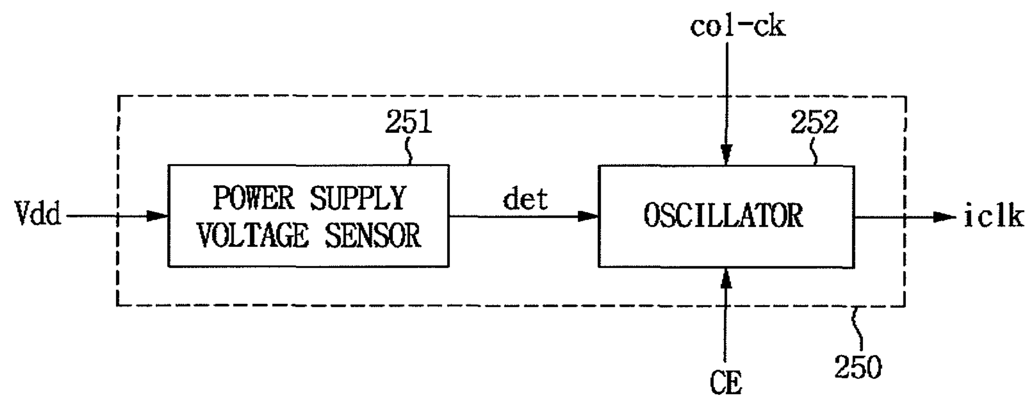
FIG. 3 illustrates an internal clock generator according to an exemplary embodiment of the inventive concept.

FIG. 3 illustrates an internal clock generator according to an exemplary embodiment of the inventive concept.

An internal clock generator 250 may change a period of an internal clock signal iclk in response to an external power supply voltage Vdd. When the internal clock generator 250 changes the period of the internal clock signal iclk in response to the external power supply voltage Vdd, the internal clock generator 250 need not receive the clock control signal col-ck from the controller 220.

The semiconductor memory device can malfunction when a level of the power supply voltage Vdd changes due to power noise. In other words, the semiconductor memory device may malfunction due to the level change of the power supply voltage Vdd, irrespective of the power noise caused by an external command or an internal circuit. Therefore, if the internal clock generator 250 senses the level change of the power supply voltage Vdd and changes the period of the internal clock signal iclk in response to the sensed level change of the power supply voltage Vdd, the result is similar to changing the period of the internal clock signal iclk in response to the clock control signal col-ck from the controller 220.

The internal clock generator 250 in FIG. 3 includes a power supply voltage sensor 251 sensing the level change of the power supply voltage Vdd and outputting a sensing signal det, and an oscillator 252 changing the period of the internal clock signal iclk in response to the sensing signal det or the clock control signal col-ck. Accordingly, the internal clock generator 250 in FIG. 2 is configured to change the period of the internal clock signal iclk in response to the level change of the power supply voltage Vdd, as well as the clock control signal col-ck. If the internal clock generator 250 changes the period of the internal clock signal CLK in response to only the clock control signal col-ck, the power supply voltage sensor 251 may not be included.

Although the internal clock generator 250 is shown as a separate circuit, it may be included in the controller 220. With a clock generator that functions as shown in FIG. 3, an exemplary embodiment of the inventive concept can reduce power noise due to a change in current consumption in the semiconductor memory device, even when the semiconductor memory device does not employ circuitry to generate a boosted voltage.

In addition, an exemplary embodiment of the inventive concept may be applied to complex memory devices including both a nonvolatile memory and a volatile memory. In particular, the complex memory device uses a volatile memory device such as a static random access memory (SRAM) as a buffer circuit when inputting/outputting data to/from the exterior to increase an operation speed of a NAND flash memory device having a low data input/output speed. In this case, when the volatile memory device performs a data input/output operation, current consumption may greatly increase and power noise may be generated. An exemplary embodiment of the inventive concept may be used to reduce power noise of such complex memory devices.

Thus, in the semiconductor memory device according to an exemplary embodiment of the inventive concept, clock periods of commands causing a lot of current consumption are set through testing, and when the commands causing a lot of current consumption are input, a clock period of an internal clock signal is changed in response to the commands to reduce power noise. In addition, a similar effect can be achieved by sensing a change in the power supply voltage and changing the clock period accordingly.

While the inventive concept has been particularly shown and described with reference to exemplary embodiments thereof, it is to be understood by those of ordinary skill in the art that various changes in form and details may be made therein without departing from the spirit and scope of the inventive concept as defined by the appended claims.

What is claimed is:

1. A semiconductor memory device, comprising:

an internal clock generator configured to generate an internal clock signal having a first clock period in response to a chip enable signal and change the first clock period of the internal clock signal in response to a clock control signal; and a controller configured to receive external commands including the chip enable signal and generate the clock control signal corresponding to a first external command other than the chip enable signal, wherein the semiconductor memory device performs a data input/output operation in response to the internal clock signal with the changed clock period, wherein the controller sets a level of the clock control signal corresponding to the first external command to be different than a level of a clock control signal corresponding to a second external command other than the chip enable signal, wherein the internal clock generator comprises an oscillator configured to change the first clock period of the internal clock signal in response to the clock control signal corresponding to the first external command and output a first resultant internal clock signal as the internal clock signal with the changed clock period.

2. The device of claim 1, wherein the internal clock generator changes the first clock period of the internal clock signal according to the level of the clock control signal corresponding to the first external command.

3. The device of claim 1, wherein the controller sets an activation period of the clock control signal corresponding to the first external command to be different than an activation period of the clock control signal corresponding to the second external command.

4. The device of claim 1, wherein the internal clock generator further comprises a power supply voltage sensor configured to receive a power supply voltage, sense a level change of the power supply voltage, and output a sensing signal, and the oscillator changes the clock period of the first resultant internal clock signal in response to the sensing signal and outputs a second resultant internal clock signal as an internal clock signal with a newly changed clock period.

5. The device of claim 1, further comprising a core unit including a plurality of memory cells, the core unit configured to select and activate a memory cell corresponding to an address.

6. The device of claim 5, further comprising a data input/output unit configured to perform the data input/output operation to input/output data to/from the core unit in response to an internal command generated by the controller decoding the first external command and in response to the internal clock signal corresponding to the first external command.

7. The device of claim 6, further comprising a boosting circuit configured to receive a boosted-voltage generation signal from the controller, generate at least one boosted voltage, and output the generated boosted voltage to the core unit.

8. The device of claim 6, further comprising a buffer circuit configured to buffer data between an exterior of the semiconductor memory device and the data input/output unit.

9. The device of claim 1, wherein the changed clock period is longer than the first clock period.

10. A semiconductor memory device, comprising:

an internal clock generator configured to generate an internal clock signal having first and second clock periods that are different from each other in response to a first external command and an internal clock signal having a third clock period different than the first and second clock periods in response to a second external command, wherein the first and second clock periods are based on current consumed by the semiconductor memory device when executing the first external command and the third clock period is based on current consumed by the semiconductor memory device when executing the second external command, wherein the internal clock generator comprises an oscillator configured to generate the first clock period in response to a clock control signal corresponding to the first external command and output a resultant internal clock signal as the internal clock signal having the first clock period.

11. The device of claim 10, wherein the first clock period is longer than the second clock period.

12. The device of claim 11, wherein the first clock period occurs when the first external command is initially executed.

13. The device of claim 12, wherein the second clock period occurs after the first clock period for a remainder of the execution of the first external command.

14. The device of claim 10, wherein the first and second external commands include program, erase, read or data input/output commands.

15. A semiconductor memory device, comprising:

an initial clock generator configured to generate an internal clock signal having a first clock period and change the first clock period of the internal clock signal in response to a level change of a power supply voltage, wherein the initial clock generator comprises:

a power supply voltage sensor configured to sense the level change of the power supply voltage and output a sensing signal; and an oscillator configured to change the first clock period of the internal clock signal in response to the sensing signal.

16. The device of claim 15, wherein the changed clock period is longer than the first clock period.

* * * * *